US010872973B2

(12) United States Patent
Lin et al.

(10) Patent No.: US 10,872,973 B2
(45) Date of Patent: Dec. 22, 2020

(54) SEMICONDUCTOR STRUCTURES WITH TWO-DIMENSIONAL MATERIALS

(71) Applicants: Taiwan Semiconductor Manufacturing Co., Ltd., Hsinchu (TW); National Taiwan University, Taipei (TW)

(72) Inventors: Shih-Yen Lin, Tainan (TW); Hsuan-An Chen, Chiayi (TW)

(73) Assignees: Taiwan Semiconductor Manufacturing Co., Ltd., Hsinchu (TW); National Taiwan University, Taipei (TW)

( * ) Notice: Subject to any disclaimer, the term of this patent is extended or adjusted under 35 U.S.C. 154(b) by 0 days.

(21) Appl. No.: 16/236,004

(22) Filed: Dec. 28, 2018

(65) Prior Publication Data

US 2020/0006541 A1    Jan. 2, 2020

Related U.S. Application Data

(60) Provisional application No. 62/691,540, filed on Jun. 28, 2018.

(51) Int. Cl.
*H01L 29/76* (2006.01)
*H01L 29/66* (2006.01)
*H01L 21/02* (2006.01)
*H01L 29/24* (2006.01)

(52) U.S. Cl.
CPC .... *H01L 29/7606* (2013.01); *H01L 21/02568* (2013.01); *H01L 29/24* (2013.01); *H01L 29/66969* (2013.01)

(58) Field of Classification Search
None
See application file for complete search history.

(56) References Cited

U.S. PATENT DOCUMENTS

| 8,791,024 B1* | 7/2014 | Lu | H01L 21/0274 |
| | | | 438/708 |
| 2007/0111487 A1* | 5/2007 | Kim | H01L 27/24 |
| | | | 438/478 |
| 2007/0145480 A1* | 6/2007 | Cheng | H01L 51/0021 |
| | | | 257/347 |
| 2016/0240719 A1* | 8/2016 | Lin | H01L 21/0262 |
| 2017/0003248 A1* | 1/2017 | Yang | G01N 27/4141 |
| 2017/0052445 A1* | 2/2017 | Weng | G03F 7/0035 |
| 2017/0250075 A1* | 8/2017 | Caymax | C23C 16/02 |

OTHER PUBLICATIONS

Chang "Novel antimonene tunneling field-effect transistors using an abrupt transition from semiconductor to metal in monolayer and multilayer antimonene heterostructures" Nanoscale, 2018, 10, pgs. 13652-13660. (Year: 2018).*
Pizzi et al. "Performance of arsenene and antimonene double-gate MOSFETs from first principles" Nature Communications, published Aug. 25, 2016, www.nature.com/naturecommunications, PDF pp. 1-9. (Year: 2016).*

* cited by examiner

*Primary Examiner* — Katie L. Hammer
(74) *Attorney, Agent, or Firm* — Seed IP Law Group LLP

(57) ABSTRACT

The current disclosure describes semiconductor devices, e.g., transistors, including a substrate, a semiconductor region including, at the surface, monolayer $MoS_2$ and/or other monolayer material over the substrate, and a terminal structure over the semiconductor region, which includes a different monolayer material grown directly over the semiconductor region.

20 Claims, 5 Drawing Sheets

SEMICONDUCTOR STRUCTURES WITH TWO-DIMENSIONAL MATERIALS

BACKGROUND

Two-dimensional (2-D) materials have been a focus of recent research efforts to exploit their novel electronic properties and great potential in semiconductor technologies, stimulated by the successful fabrication of graphene. Although graphene includes high carrier mobility value, its zero-bandgap nature, i.e., the semimetallic properties, limits its application in semiconductor devices. The 2-D allotrope of black phosphorus, phosphorene, is another widely studied 2-D material, which is expected to have high mobility values and visible bandgap. One disadvantage of phosphorene is its rapid degradation under the atmospheric condition.

BRIEF DESCRIPTION OF THE SEVERAL VIEWS OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
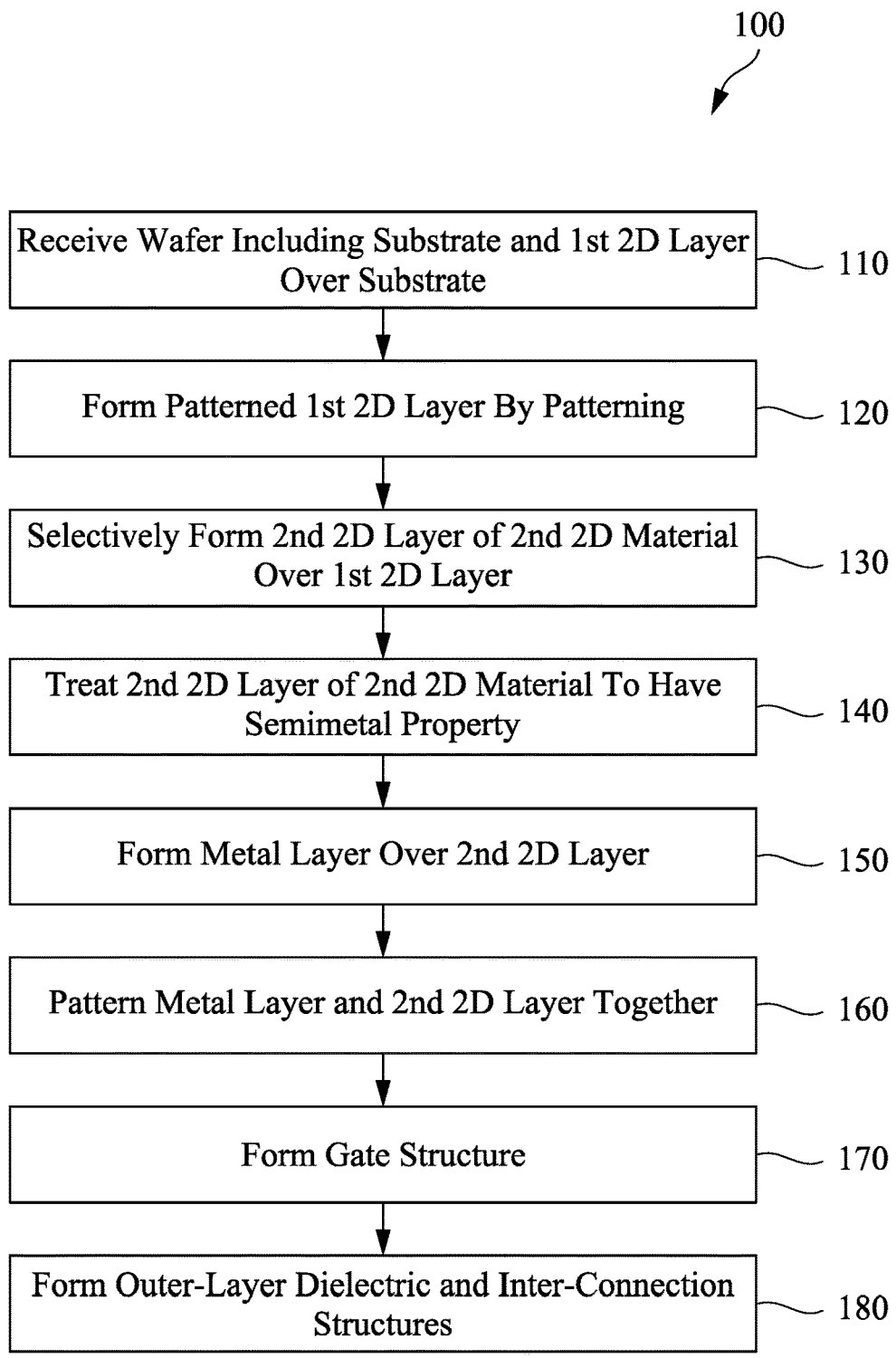
FIG. 1 illustrates an example process of making a 2-D material according to embodiments of the disclosure.

This application describes embodiments of methods of selective growth of a two-dimensional (2-D) material on a surface of another 2-D material, and related devices. Techniques in accordance with embodiments described herein are directed to a novel process to fabricate a second 2-D material over a surface of a base layer of a first 2-D material. A "2-D material" refers to a material of a crystalline structure consisting of a single layer of atoms, which is also referred to as a "single-crystal" material.

In an embodiment, the second 2-D material is antimonene. The first 2-D material of the base layer is one or more of $MoS_2$, $WS_2$, $MoSe_2$ or $WSe_2$ or other 2-D materials. The base layer of the first 2-D material is positioned over a substrate of silicon, sapphire or other suitable substrate.

The inventor observed that a base of a first 2-D material facilitates the formation of a second material thereover due to the low surface energy of the base, and that there is no vertical bonding force on the surface of the base. Such advantages of the base layer of 2-D materials differentiate the base layer from other surface areas of a wafer beyond the base layer. The differentiation is utilized in the disclosed techniques to achieve the selective formation of a second 2-D material over a patterned base layer of a first 2-D material. The selective growth of the second 2-D material over the base of the first 2-D material controls a growth condition that prevents the second 2-D material from forming or remaining on a surface of the substrate beyond the base of the first 2-D material. Such selective formation of the 2-D material has advantageous practical applications. For example, the second 2-D material is naturally patterned based on the pattern of the base 2-D material. This characteristic can greatly save critical dimension allowance in newer technology nodes, e.g., sub-7 nm technologies, because no photolithography is needed for the second 2-D material and any other layers of 2-D materials over the second 2-D material. Note that the photolithography accuracy and sensitivity issues are among the major hurdles on sub-7 nm technology nodes. Further, the selective growth technique can be readily used in forming a nanowire vertical stack of 2-D material layers.

Specifically in an embodiment, a 2-D $MoS_2$ layer is formed and patterned on a substrate, e.g., a silicon substrate or a sapphire substrate. Antimonene material is deposited globally over a wafer having the patterned base layer of 2-D $MoS_2$ under molecular beam epitaxy (MBE) process or other suitable process. With a controlled growth condition, for example, a growth temperature ranging between 150° C. to 300° C., the single-crystal antimonene material does not form or stay over the substrate, and stays only on top of the patterned 2-D $MoS_2$. The upper surface of the $MoS_2$ base layer does not include chemical or covalent bonding links in the vertical direction, and includes chemical or covalent bonding links within the two-dimensional plane between/among atoms of sulfur (S) and molybdenum (Mo). Such a surface of the base layer helps the formation of the 2-D antimonene thereon. Further, a van der Waals bonding force between the molecules of the 2-D $MoS_2$ of the base layer and the molecules of the 2-D antimonene grown over the base layer leads to satisfactory van der Waals heterostructure between the 2-D antimonene and the 2-D $MoS_2$. For example, the pattern of the antimonene layer essentially follows the pattern of the underlying base layer of $MoS_2$.

In a method of making a transistor device, a wafer is provided, which includes a substrate, e.g., sapphire or a silicon, and a base layer of a first 2-D material, e.g., $MoS_2$, over the substrate. The base layer is patterned to define an active area of a device. A layer of 2-D antimonene is selectively formed over the patterned $MoS_2$ base layer only. The thickness of the antimonene layer is controlled such that the antimonene layer exhibits semimetal properties of electrical conductivity. The thickness of the underlying $MoS_2$ base layer is controlled such that the $MoS_2$ base layer exhibits semiconductor properties. The antimonene layer is then patterned to form a source contact and a drain contact, and to expose a portion of the underlying base layer of $MoS_2$ between the source contact and the drain contact. A gate structure is formed on the exposed portion of the $MoS_2$ layer and between the source contact and the drain contact of antimonene. The $MoS_2$ layer is configured as a semiconductor body.

Techniques in accordance with embodiments described herein are also directed to a novel process to fabricate a 2-D material. Embodiments of the current disclosure receive a wafer with a patterned base layer of a first 2-D material over a substrate, and form a second different 2-D material selectively over the base layer of the first 2-D material. Because the first 2-D material of the base layer does not have vertical bonding among atoms/molecules, the surface energy of the interface between the base layer and the formed second 2-D material is very low; as such, the crystalline quality of the second 2-D materials grown over the base layer is efficiently and effectively improved. At the same time, the substrate beyond the patterned base layer does not include such properties, and the second 2-D material may not stay over such portions of the substrate under some growth conditions. Therefore, the deposit conditions can be selectively controlled such that the second 2-D material is formed satisfactorily on the patterned base layer of the first 2-D material and is not formed beyond the patterned base layer. As such the precursors of the second 2-D material can be globally deposited over the whole wafer, which makes the growth process easier to implement.

In an embodiment, a transition metal dichalcogenide (TMD) monolayer material, e.g., $MoS_2$, $WS_2$, $MoSe_2$, $WSe_2$, or $MoTe_2$ is provided and patterned over a silicon or sapphire substrate as a base layer for the growth of a monolayer allotrope of antimony, i.e., antimonene. The lower interface energy between antimonene and the TMD monolayer materials leads to a complete film growth of antimonene over the surface of the base TMD film. The antimonene growth may be effected through molecular beam epitaxy (MBE), physical vapor deposition (PVD), or other suitable forming approaches with a low growth temperature ranging from about 150° C. to about 300° C. for a time duration ranging from about 10 seconds to about 600 seconds. The inventor observed that at a growth temperature higher than 150° C., the antimonene material does not form or effectively dissolve on the silicon or sapphire interface, and is formed only over the patterned TMD monolayer. The growth conditions, e.g., temperatures, of the antimonene layer may be varied based on the substrate interface, which the antimonene precursors are globally deposited on.

For example, in the case where the patterned $MoS_2$ base is positioned on a silicon oxide $SiO_2$ layer over a silicon substrate, the growth temperature ranges from about room temperature to about 320° C., and an annealing process may be performed on a formed antimonene and antimony layer to re-crystalize the antimony into the monolayered structure. The annealing process may be carried out at a temperature within a range of about 200° C. to about 400° C. The annealing process may facilitate the growth of layered antimonene and/or may improve the crystalline quality of imperfectly grown antimonene layers over the patterned $MoS_2$ base. The annealing process will not facilitate antimonene formation over the $SiO_2$ layer beyond the $MoS_2$ base.

The present techniques of fabricating antimonene described herein selectively utilize the technical characteristic of antimonene desorption under higher growth temperatures, e.g., higher than 150° C. for MBE, and the problems of amorphous droplet formation, which prevents the formation of large scale antimonene flakes. In accordance with disclosed embodiments, the antimonene flakes are satisfactorily formed over a patterned base of TMD monolayer material, and are not formed beyond the TMD monolayer under a temperature higher than 150° C. for MBE.

Further, the van der Waals bonding force between the molecules of the first 2-D material of the base layer and the molecules of the second 2-D material grown over the base layer leads to satisfactory van der Waals heterostructure between the first 2-D material and the second 2-D material. Such van der Waals heterostructure may be readily utilized in electronic devices, e.g., transistors, sensors and photonic devices.

In an embodiment, the first 2-D material may be selected and/or treated to have desirable semiconductor electronic properties, e.g., indirect band gap. The second 2-D material grown over the first 2-D material may be selected and/or treated to have semimetal electronic properties, e.g., zero band gap and electrically conductive.

Further, the second 2-D material's electronic properties may include different states of semimetal, insulator and semiconductor, depending on the thickness of the layers, namely, the number of monolayers of the second 2-D material. The disclosed techniques also include controlling the thickness of the second 2-D material grown over the patterned base layer of the first 2-D material. In an example, the thickness of the second 2-D material may be increased by prolonging the growth time. At least partially because of the van der Waals bonding force between the molecules of the first 2-D material of the base layer and the molecules of the second 2-D material, the thickness of the second 2-D material may be reduced without damaging the heterostructure. In an embodiment, the thickness (i.e., layers) of the second 2-D material or the first 2-D material may be effectively reduced by plasma-based dry etching, e.g., reactive-ion etching.

In an embodiment, a device is made taking advantage of the disclosed techniques of selectively growing the second 2-D material. A substrate and a first layer of a first 2-D material over the substrate are provided. The first layer of the first 2-D material exhibits semiconductor properties. The first layer of the first 2-D material is patterned to define a semiconductor body or an active area of a device. A second layer of a second 2-D material is selectively formed directly over the first 2-D material using, e.g., the techniques described herein. The second layer of the second 2-D material exhibits a semimetal property. The second layer of the second 2-D material is patterned to form a terminal region, e.g., a source/drain region, of the device. With the 2-D-2-D interface between the first 2-D material as the body region and the second 2-D material as the source/drain terminal contact, the contact resistance between the source/drain terminal and the body region is substantially reduced, and an Ohmic contact is effectively achieved.

In an example, the sheet resistance of an antimonene film is determined at about $2.31 \times 10^2$ $\Omega$/sq. The contact resistance value between an Au/antimonene electrode and a $MoS_2$ semiconductor is about 7.85 $\Omega cm^2$. This resistance value is very low. As an illustrative example, the contact resistance between an Au/Ti electrode and a $MoS_2$ semiconductor is about $3.09 \times 10^3$ $\Omega cm^2$, which is three orders of magnitude higher than the Au/antimonene electrode.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity, and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The following description references a transistor as an example of a semiconductor structure to which the present description applies; however, the present description is not limited in applicability to transistors. For example, the following description applies to other types of semiconductor structures that are not transistors where the provision of low resistance electrical contact at junctions between features exhibiting semiconductor properties and features exhibiting electrical conductive properties, e.g., metal properties, are desirable.

FIG. 1 illustrates an example fabrication process 100 which can be used to selectively form a second 2-D layer of a second 2-D material over a first 2-D layer of a first 2-D material and to make an electronic device using the first 2-D layer and the second 2-D layer. As used herein, consistent with the accepted definition within solid state material art, a "2-D material" refers to a crystalline material consisting of a single layer of atoms. As widely accepted in the art, "2-D material" may also be referred to as a "monolayer" material. In this disclosure, "2-D material" and "monolayer" material are used interchangeably without differentiation in meanings, unless specifically pointed out otherwise.

Figure 2A:
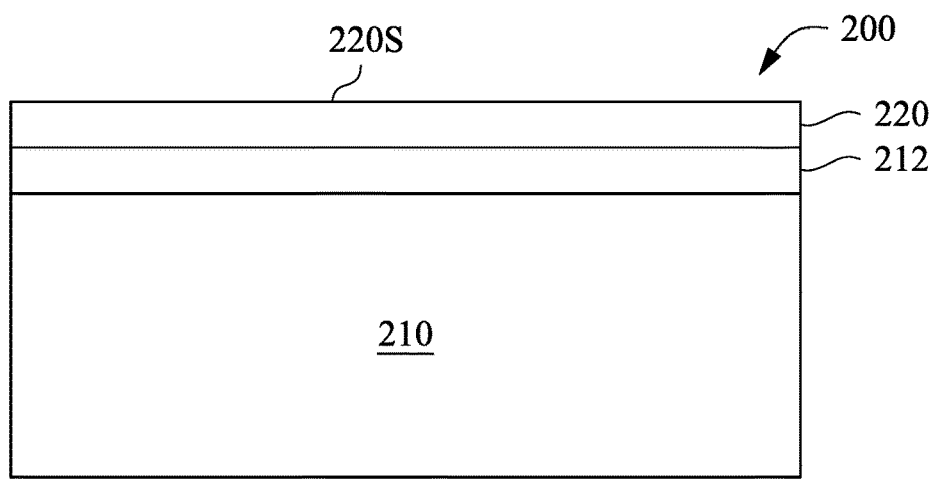
FIGS. 2A-2H illustrate cross-sectional views of an example wafer at various stages of fabrication according to embodiments of the disclosure.

Referring to FIG. 1, with reference also to FIG. 2A, at example operation 110, a wafer 200 is provided. Wafer 200 includes a substrate 210 and a base layer (or "first 2-D layer") 220 of a first 2-D material. The first 2-D material may be any 2-D materials of any number of monolayers. As appreciated, a 2-D material includes a single layer of atoms in each of its monolayer structures, so the thickness of the 2-D material refers to a number of monolayers of the 2-D material, which can be one monolayer or more than one monolayer. The coupling between two adjacent monolayers of 2-D material includes van der Waals forces, which are weaker than the chemical bonds between/among atoms within the single monolayer.

As the first 2-D layer 220 is provided for the growth of a second 2-D layer thereover, in an embodiment, an upper surface 220S of the first layer of the first 2-D material includes no vertical bonding among atoms, at least for the portions of upper surface 220S where a second 2-D layer of a second 2-D material will be grown.

In an example, the substrate 210 is a silicon substrate, and a silicon oxide layer 212 is formed over the silicon substrate 210. The first 2-D layer 220 includes $MoS_2$ of a thickness ranging from about two monolayers, namely bi-layer $MoS_2$, to about six monolayers. The inventor observed that 2-D $MoS_2$ of two to six monolayers exhibits semiconductor properties, including an indirect bandgap. A single monolayer of 2-D $MoS_2$ exhibits semiconductor properties, including a direct bandgap. In an illustrative embodiment, the first 2-D layer 220 is bi-layer $MoS_2$.

In an embodiment, receiving the wafer 200 includes forming the first 2-D layer 220 of the first 2-D material over substrate 210. Forming the first 2-D layer 220 may include any suitable processes depending on the specific first 2-D material and the specific substrate 210. In an embodiment, the first 2-D material includes a transition metal dichalcogenide (TMD) monolayer material. As appreciated, a TMD monolayer includes one layer of transition metal atoms sandwiched between two layers of chalcogen atoms. The substrate 210 includes any substrates that are suitable for the formation of the TMD monolayers thereover. For example, substrate 210 may be selected based on its capacity to sustain the potential high temperature in the formation of the TMD monolayers thereover. In an embodiment, a sapphire substrate 210 is used. Other elementary semiconductors like germanium may also be used for substrate 210. Alternatively or additionally, substrate 210 includes a compound semiconductor such as silicon carbide, gallium arsenide, indium arsenide, indium gallium arsenide (InGaAs) and/or indium phosphide. Further, substrate 210 also includes a silicon-on-insulator (SOI) structure. The substrate 210 may also be other suitable substrates, which are all included in the disclosure and non-limiting. The substrate 210 may include an epitaxial layer and/or may be strained for performance enhancement. The substrate 210 may also include various doping configurations depending on design requirements, such as P-type substrate and/or N-type substrate, and various doped regions such as P-wells and/or N-wells.

As an illustrative example, in the description herein, the substrate 210 is a silicon substrate and the first 2-D material is $MoS_2$. A silicon oxide layer 212 is positioned over the silicon substrate and between the substrate 210 and first 2-D layer 220.

$MoS_2$ may be formed on the silicon oxide layer 212 over the silicon substrate 210 through micromechanical exfoliation, and coupled over the silicon oxide layer 212. In an embodiment, $MoS_2$ layer 220 is formed through sulfurizing a molybdenum (Mo) film predeposited over the silicon oxide layer 212 at a processing temperature ranging between about 600° C. to about 950° C.

In an embodiment, the receiving the wafer 200 also includes treating the first 2-D layer 220 of the first 2-D material to obtain expected electronic properties of the first layer 220 of the first 2-D material. The treating processes include thinning (namely, reducing the thickness of the first 2-D layer 220 of the first 2-D material), doping, or straining, to make first layer 220 of the first 2-D material exhibit certain semiconductor properties, e.g., including indirect bandgap. The thinning of the first 2-D material may be achieved through various suitable processes, and all are included in the present disclosure. In an example, plasma-based dry etching, e.g., reaction-ion etching (RIE), may be used to reduce the number of monolayers of the first layer 220 of the first 2-D material.

In the description hereinafter, the first layer 220 of a thin film of $MoS_2$ having semiconductor properties is used as an illustrative example for descriptive purposes. Each monolayer of $MoS_2$ is about 6.5 angstrom (Å) in thickness. In an embodiment, the first layer 220 of $MoS_2$ is about 1.5 nm in thickness, namely equal to about two monolayers of $MoS_2$ (bi-layer). It should be appreciated that other TMDs like molybdenum diselenide ($MoSe_2$) or other 2-D materials like group V arsenene (As) and phosphorene ($\alpha$-P) are also candidates for the first 2-D material of the first 2-D layer 220.

Figure 2B:
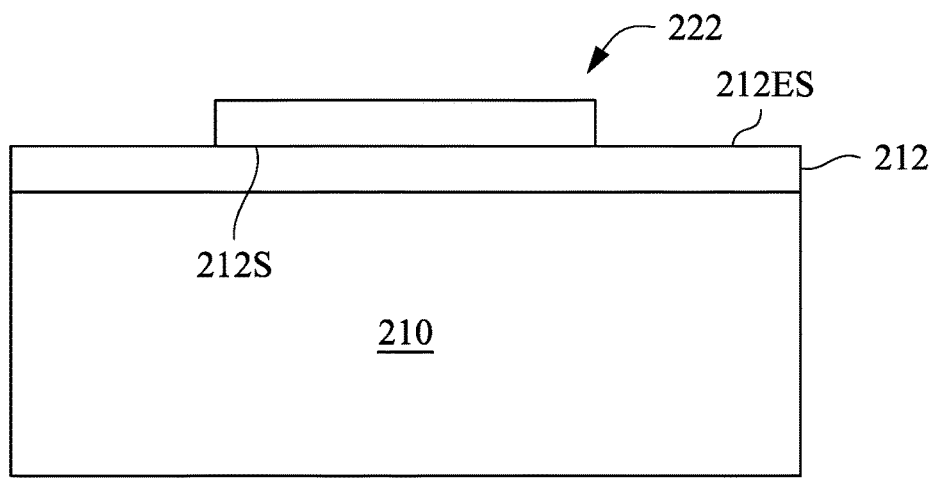

In example operation 120, with reference also to FIG. 2B, the first 2-D layer of the first 2-D material is patterned to define an active area of a semiconductor device. As shown in FIG. 2B, the $MoS_2$ layer 220 is patterned to become a $MoS_2$ pattern 222. The patterning of the $MoS_2$ layer 220 may be conducted through photolithography and etching or other suitable patterning processes. When the $MoS_2$ pattern 222 is formed, a portion 212ES of upper surface portion 212S of the silicon oxide layer 212 is exposed from the $MoS_2$ pattern 222.

Figure 2C:
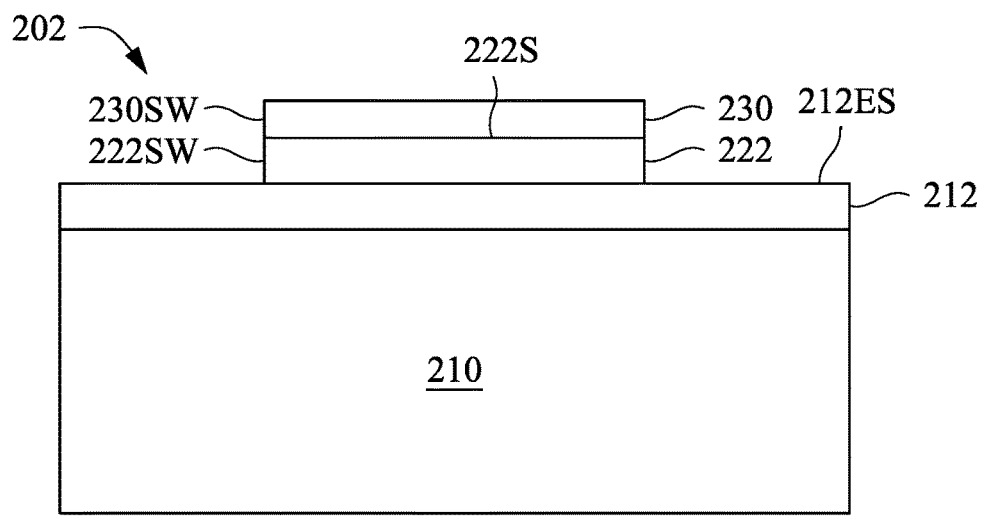

In example operation 130, with reference also to FIG. 2C, a second layer 230 of a second 2-D material is selectively formed over the patterned first layer 222 of the first 2-D material $MoS_2$. The second 2-D material is different from the first 2-D material at least in the composition. The second 2-D material may be any 2-D material and may be deposited using any process suitable for the specific 2-D material. The deposition conditions are controlled such that the second 2-D material is formed only over the $MoS_2$ pattern 222 and does not form or remain on the exposed surface portion 212ES of the underlying $SiO_2$ layer 212. For example, in an illustrative case where the second 2-D material is antimonene, the growth temperature is controlled to be between about 150° C. to about 300° C. At this temperature range, the antimonene material does not remain over the interface surface 212ES of the $SiO_2$ layer 212. As such, even if the deposition of the antimonene is conducted over the whole surface of the wafer 200, the antimonene layer only remains on top of the first layer 222 of the first 2-D material $MoS_2$. Beyond the patterned first layer 222 any deposited antimonene material will not form antimonene and/or will dissolve under the temperature conditions between about 150° C. to about 300° C.

Because the second layer 230 of the second 2-D material is selectively formed over the patterned first layer 222 of $MoS_2$, sidewalls 230SW of the second layer 230 are coterminous with sidewalls 222SW of the patterned first layer 222 of $MoS_2$.

In an example, the second 2-D material may be formed with a semimetal electronic property, or may be treated to exhibit a semimetal property. As used herein, a semimetal electronic property ("semimetal property") refers to an absence of a bandgap and a negligible density of states at the Fermi level. A semimetal material or a semimetal state of a material has both holes and electrons that contribute to electrical conduction and the electrically conductive property of a semimetal material.

In an example, the second 2-D material is antimonene (Sb). Antimonene layer 230 may be formed over the patterned first 2-D layer 222 of $MoS_2$ using any suitable processes, and all are included in the disclosure. In an embodiment, antimonene layer 230 may be grown over the patterned first 2-D layer 222 of $MoS_2$ using molecular beam epitaxy (MBE) or physical vapor deposition (PVD) processes with a growth temperature ranging from 150° C. to about 300° C. for a time duration ranging from about 10 seconds to about 600 seconds. This growth temperature range supports the selective growth of the antimonene over the patterned first layer 222 of $MoS_2$ without formation of antimonene over the exposed surface portion 212ES of the $SiO_2$ layer 212. As such, the deposition of the antimonene precursors may be globally conducted over the whole surface 202 of the wafer 200 without differentiation between the patterned $MoS_2$ layer 222 and the rest of the surface 202 of the wafer 200, e.g., exposed surface portion 212ES of the $SiO_2$ layer 212. With the controlled growth temperatures within 150° C. to about 300° C., the selective growth of the antimonene layer 230 only over the patterned $MoS_2$ layer 222 is achieved. In an embodiment, with the antimonene layer 230 formed satisfactorily, the antimonene layer 230 follows the pattern of the patterned $MoS_2$ layer 222. That is, the antimonene layer 230 completely overlaps the patterned $MoS_2$ layer 222.

In an example, the growth temperature may be established by heating the substrate 210 and the patterned $MoS_2$ layer 222 beforehand, and the heating may be stopped when the formation of the antimonene layer 230 starts, e.g., when the deposition of the precursors starts.

Optionally and additionally, an annealing process may be conducted on the antimonene layer 230 at an annealing temperature ranging from about 200° C. to about 400° C. for a sufficient period of time, e.g., about 7 to 15 minutes, to convert imperfectly formed antimonene, i.e., the antimony allotrope, into antimonene. The inventor observed that annealing within this temperature range and time duration range results in better formation of antimonene sheets compared to annealing outside this temperature range and time duration range. That is, annealing under these conditions recrystallizes deposited antimony material or some antimony impurities into monolayer antimonene.

In an embodiment, the second 2-D layer 230 of antimonene includes monolayers of antimonene which have substantially zero contact angle (not shown in FIG. 2C for simplicity) with respect to an upper surface 222S of the patterned $MoS_2$ layer 222.

In an example, the generated antimonene layer 230 is the $\beta$ allotrope of antimonene.

In an embodiment, in example operation 140, the second 2-D layer 230 of antimonene is treated so that it exhibits the desired electronic properties. For example, a thickness of second 2-D layer 230 is controlled such that the second 2-D layer 230 exhibits electronic properties suitable for the design and application requirements. In an example, the thickness of the second 2-D layer 230 may be initially controlled by adjusting the time duration of the growth process, e.g., the MBE and/or the TBC procedures. For example, a longer MBE process will produce a thicker second 2-D layer 230 initially, namely more layers of monolayer antimonene. The thickness may be further controlled by a thinning process to reduce the number of antimonene monolayers of the second 2-D material.

For example, the antimonene layer 230 may be thinned through plasma-based dry etching, e.g., a reactive-ion etching, to control the electronic properties thereof. In an example, when the thickness of the antimonene layer 230 is equal to or larger than a first threshold, e.g., about 12 angstrom (Å) or three monolayers of antimonene, the antimonene layer 230 exhibits semimetal properties. When the thickness of the antimonene layer 230 is equal to or smaller than a second threshold, e.g., about 8 angstrom (Å) or two monolayers of antimonene, the antimonene layer 230 exhibits semiconductor properties. For other 2-D materials of the second 2-D layer 230, the first and second thresholds in thickness may vary, which are included in the disclosure.

Other bandgap opening techniques, e.g., straining or doping, may also be used to cause the antimonene layer 230 to have the desired electronic properties.

Figure 2D:
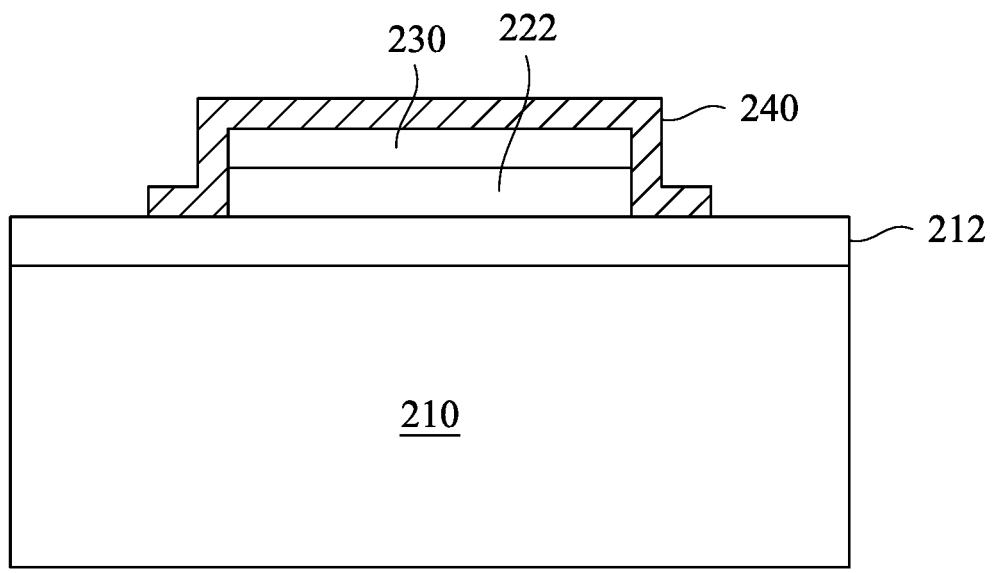

In example operation 150, with reference also to FIG. 2D, a metal layer 240 is formed over the second 2-D layer 230. The metal layer 240 is gold (Au), tungsten (W), cobalt (Co) or other suitable metal/conductive materials for terminal electrodes. Other suitable metal/conductive materials for terminal electrodes include ruthenium, palladium, platinum, nickel, and/or conductive metal oxides and other suitable materials for P-type metal materials, and may include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N-type metal materials. The metal layer 240 may be formed through sputtering or other suitable processes like CVD, PVD, plating, or other suitable process.

In an example, the metal layer 240 is formed and patterned in a same process, e.g., a lift-off process or a damascene process.

In an embodiment, the second 2-D layer 230 of antimonene is annealed after the formation of the metal layer 240.

Figure 2E:
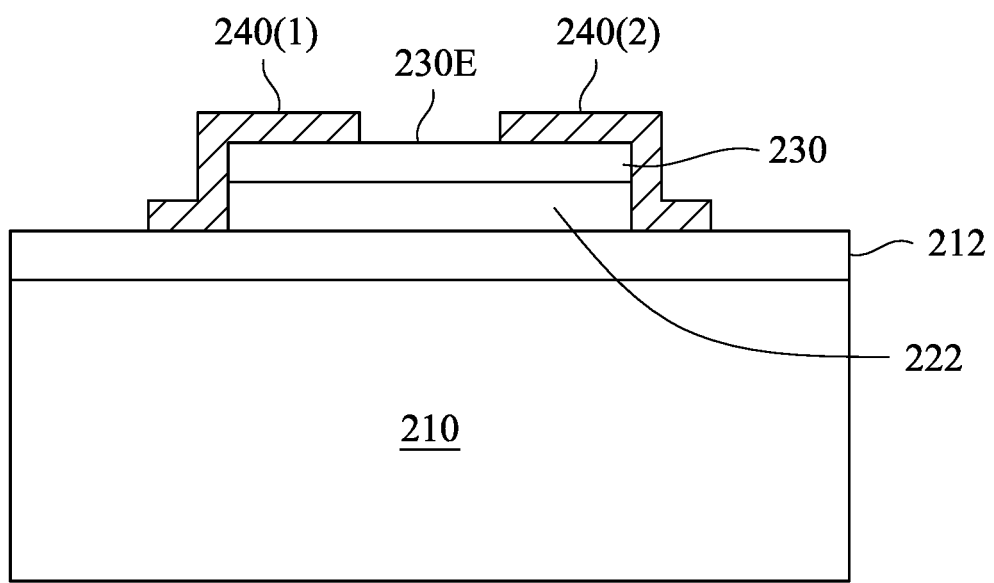
Figure 2F:
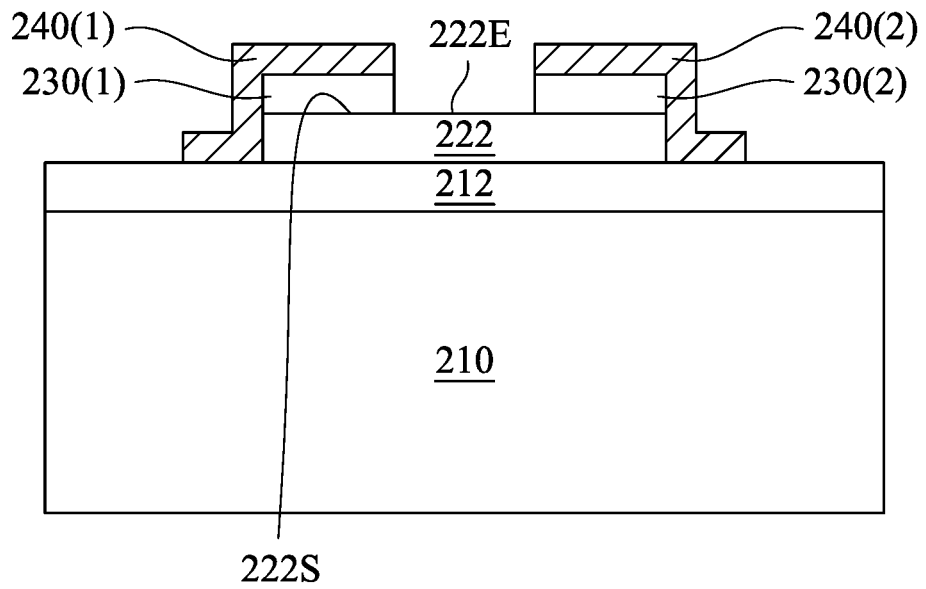

In example operation 160, with reference also to FIGS. 2E and 2F, the metal layer 240 and the second 2-D layer 230 of the second 2-D material are patterned to form two discrete portions for each of the two layers. Specifically, as shown in FIG. 2E, the metal layer 240 is patterned to formed discrete portions 240(1), 240(2), with a portion 230E of the second 2-D layer 230 exposed through the patterning.

Subsequently, as shown in FIG. 2F, the second 2-D layer 230 is patterned through the exposed portion 230E to form discrete portions 230(1), 230(2). A portion 222E of the surface 222S of the patterned first 2-D layer 222 is exposed between the two discrete portions 230(1), 230(2) of the second 2-D layer 230. The patterning is conducted through photolithography and etching or other suitable patterning processes. The etching is selective with respect to the underlying patterned first 2-D layer 222.

In another embodiment, the metal layer 240 and the second 2-D layer 230 may be patterned together in a single step to form portions 230(1), 230(2), 240(1), 240(2) and to expose the portion 222E.

Figure 2G:
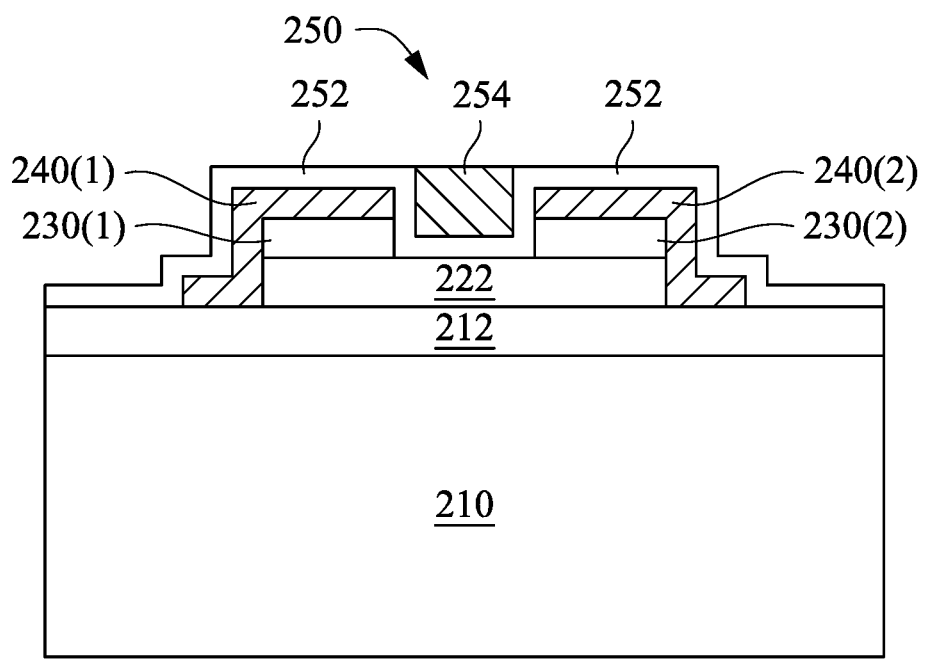

In example operation 170, with reference also to FIG. 2G, a gate structure 250 is formed over the exposed portion 222E between the discrete portions 230(1), 230(2) of the second 2-D layer 230. The gate structure 250 includes a gate dielectric 252 and a gate electrode 254. The gate dielectric layer 252 is a high-K dielectric material formed by atomic layer deposition (ALD) or other suitable technique. In an example, high-K dielectric layer 252 includes a thickness ranging from about 5 to about 20 angstrom (Å) or other suitable thickness, depending on design and process requirements/variations. The gate electrode 254 is a conductive gate, e.g., formed of a metal or a conductive metal compound.

Figure 2H:
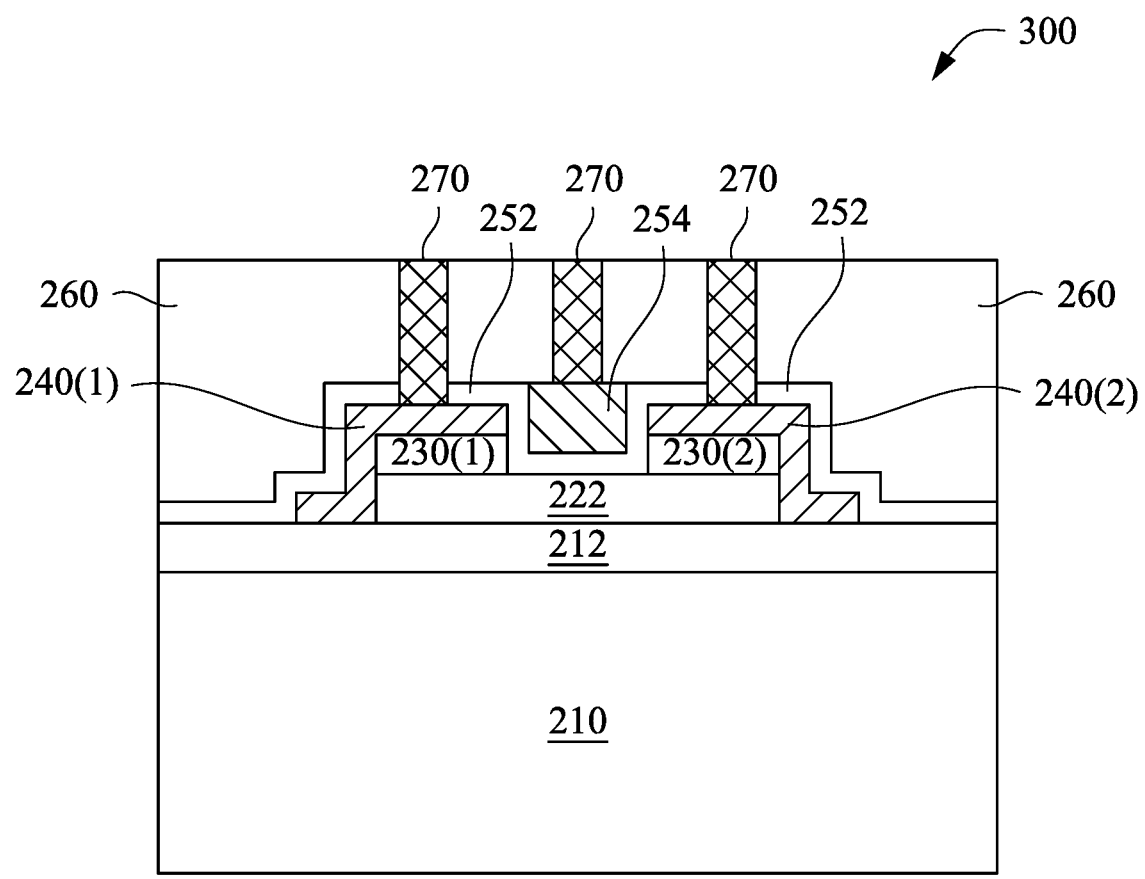

In example operation 180, with reference also to FIG. 2H, an inter-layer dielectric ILD 260 and interconnection structures 270 are formed. The ILD 260 is silicon oxide or a low-K dielectric material. The interconnection structures 270 are copper Cu, cobalt Co, tungsten W or aluminum Al or other suitable conductive materials. In an embodiment, the interconnection structures 270 are formed through the ILD 260 using a damascene process.

An example transistor device 300 is configured using the structure of FIG. 2H. The patterned first 2-D layer 222 of $MoS_2$ exhibits a semiconductor property of indirect bandgap, and is configured as a semiconductor body. As referred to herein, a semiconductor property of a material, or a semiconductor state of a material, indicates that for the material or the state of the material, the Fermi level (EF) lies inside a gap between a filled valence band and an empty conduction band, namely a "bandgap," and the bandgap is larger than zero and smaller than 4 electron-volt (eV). As a 2-D material may undergo transitions between and/or among semiconductor state, insulator state or semimetal state, the term "bandgap opening" is used herein to refer to a state of the 2-D material where a bandgap, direct or indirect, exists in the electronic state of the 2-D material such that the 2-D material exhibits a semiconductor property. As described herein, the semiconductor state of the patterned first 2-D layer 222 of $MoS_2$ may be obtained through one or more of selective formation, thinner/fewer number of monolayers, or other bandgap opening techniques like doping or straining.

In an embodiment, the first 2-D material of the layer 222 is $MoS_2$. Other TMD materials, e.g., $MoSe_2$, or other 2-D materials may also be used in the patterned first 2-D layer 222, which are included in the disclosure.

In an embodiment, the boundary of the patterned first 2-D layer 222 may be further defined by insulation features like local field oxide regions over the silicon oxide layer 212, which are not shown for simplicity.

The discrete portions 230(1), 240(1), 230(2), 240(2) are configured as terminal structures, e.g., source/drain terminals in a field effect transistor. In an embodiment, each terminal structure includes a terminal contact 230(1), 230(2) and a terminal electrode 240(1), 240(2).

In an embodiment, the terminal contacts 230(1), 230(2) are β allotrope antimonene that exhibit semimetal properties. For example, a thickness of each terminal contact 230(1), 230(2) is equal to or larger than a first threshold, e.g., 12 angstrom (Å), such that the antimonene material exhibits semimetal properties.

The terminal electrode 240(1), 240(2) are formed of any conductive material suitable for forming a conductive electrode, e.g., a metal or metal compound.

The gate dielectric layer 252 is a high-k (high dielectric constant) dielectric selected from one or more of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfArO), combinations thereof, and/or other suitable materials. A high-K dielectric material includes a dielectric constant value larger than that of thermal silicon oxide (~3.9), and in some applications, may include a dielectric constant (K) value larger than 6. Depending on design requirements, a dielectric material of a dielectric constant (K) value of 7 or higher may be used.

The gate electrode 254 is conductive and includes a metal or a metal compound. Suitable metal materials for the gate electrode 254 include ruthenium, palladium, platinum, cobalt, nickel, and/or conductive metal oxides and other suitable P-type metal materials and may include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N-type metal materials. In some examples, gate electrode 254 includes a work function layer tuned to have a proper work function for enhanced performance of the field effect transistor devices. For example, suitable N-type work function metals include Ta, TiAl, TiAlN, TaCN, other N-type work function metal, or a combination thereof, and suitable P-type work function metal materials include TiN, TaN, other P-type work function metal, or combination thereof.

The example transistor 300 is provided as an illustrative example embodiment, which does not limit the scope of the disclosure. The techniques of selectively forming a layer of a second 2-D material over a patterned layer of a first 2-D material may be used to make other devices, which are all included in the disclosure. With the second 2-D layer patterned to be a source/drain contact between the semiconductor body of the first 2-D material and the conductive source/drain electrode, the heterostructure of the first 2-D material and the second 2-D material includes a 2-D-2-D interface between the first 2-D material of semiconductor state and the second 2-D material of semimetal state. Therefore, the heterostructure does not suffer from metal-semiconductor junction issues, and serves as an effective Ohmic contact.

The foregoing outlines features of several embodiments so that those skilled in the art may better understand the aspects of the present description. Those skilled in the art should appreciate that they may readily use the present description as a basis for designing or modifying other processes and structures for carrying out the same purposes and/or achieving the same advantages of the embodiments introduced herein. Those skilled in the art should also realize that such equivalent constructions do not depart from the spirit and scope of the present description, and that they may make various changes, substitutions, and alterations herein without departing from the spirit and scope of the present description.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The present disclosure may be further appreciated with the description of the following embodiments:

In a method embodiment, a wafer is received. The wafer includes a substrate and a first layer of a first two-dimensional material over the substrate. A first pattern of the first two-dimensional material is formed by patterning the first layer. A second layer of a second two-dimensional material is selectively formed over the first pattern. The second layer of the second two-dimensional material substantially overlaps the first pattern.

In another method embodiment, a wafer is received. The wafer includes a substrate and a first layer of a first two-dimensional material over the substrate. A first pattern of the first two-dimensional material is formed by patterning the first layer of the first two-dimensional material. The first pattern of the first two-dimensional material exhibits a semiconductor property. A second layer of a second two-dimensional material is formed over the first pattern of the first two-dimensional material. The second layer of the second two-dimensional material has sidewalls that are coterminous with sidewalls of the first pattern. A conductive layer is formed over the second layer of the second two-dimensional material. The conductive layer and the second layer of the second two-dimensional material are patterned to form a source structure and a drain structure. An exposed portion of the first pattern is also formed between the source structure and the drain structure. A gate structure is formed over the exposed portion of the first pattern.

A structure embodiment provides a substrate, a semiconductor body of a first two-dimensional material over the substrate and having a first surface, a source/drain contact of a second two-dimensional material over the semiconductor body and on the first surface, and a gate structure over the semiconductor body, on the first surface, and adjacent to the source/drain contact.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
   receiving a wafer including a substrate and a first layer of a first two-dimensional material over the substrate;
   forming a first pattern of the first two-dimensional material by patterning the first layer; and
   selectively forming a second layer of a second two-dimensional material over the first pattern, the second layer of the second two-dimensional material overlapping only the first pattern.

2. The method of claim 1, further comprising thinning the first layer of the first two-dimensional material such that the first layer of the first two-dimensional material exhibits a semiconductor property.

3. The method of claim 2, further comprising heating the substrate and the first pattern of the first two dimensional material before forming the second layer of the second two-dimensional material.

4. The method of claim 1, wherein the first two-dimensional material is a transition metal dichalcogenide (TMD) material.

5. The method of claim 1, wherein the first two-dimensional material exhibits a semiconductor property.

6. The method of claim 1, wherein the first two-dimensional material is molybdenum disulfide with a thickness ranging from about two monolayers of two-dimensional molybdenum disulfide to about six monolayers of two-dimensional molybdenum disulfide.

7. The method of claim 1, wherein the selectively forming the second layer of the second two-dimensional material over the first pattern includes growing the second two-dimensional material globally over the wafer with a growth condition that prevents the second two-dimensional material from bonding to a surface of the wafer outside the first pattern.

8. The method of claim 7, wherein the second two-dimensional material is antimonene and the growth condition includes a growth temperature higher than 150° C.

9. A method, comprising:
receiving a wafer including a substrate and a first layer of a first two-dimensional material over the substrate;
forming a first pattern of the first two-dimensional material by patterning the first layer of the first two-dimensional material, the first pattern of the first two-dimensional material exhibiting a semiconductor property;
forming a second layer of a second two-dimensional material over the first pattern of the first two-dimensional material, the second layer of the second two-dimensional material having sidewalls that are coterminous with sidewalls of the first pattern;
forming a conductive layer over the second layer of the second two-dimensional material;
patterning the conductive layer and the second layer of the second two-dimensional material to form a source structure and a drain structure and an exposed portion of the first pattern between the source structure and the drain structure; and
forming a gate structure over the exposed portion of the first pattern.

10. The method of claim 9, further comprising treating the second layer of the second two-dimensional material such that the second layer exhibits a semimetal property.

11. The method of claim 9, wherein the first two-dimensional material is molybdenum disulfide.

12. The method of claim 9, wherein the second two-dimensional material is antimonene.

13. The method of claim 9, further comprising annealing the second layer of the second two-dimensional material.

14. The method of claim 13, wherein the annealing is conducted after the conductive layer is formed.

15. The method of claim 9, further comprising reducing a thickness of the first layer of the first two-dimensional material.

16. The method of claim 1, wherein the second-two dimensional material exhibits a semimetal property.

17. The method of claim 8, wherein the second two-dimensional material is a $\beta$ allotrope of antimonene.

18. The method of claim 1, further comprising forming a conductive layer over the second two-dimensional material.

19. The method of claim 18, further comprising patterning the conductive layer and the second two-dimensional material together to form a source/drain structure.

20. The method of claim 12, wherein the second two-dimensional material is a $\beta$ allotrope of antimonene.

* * * * *